United States Patent
Schöler et al.

(10) Patent No.: US 12,209,327 B2
(45) Date of Patent: Jan. 28, 2025

(54) PVT-METHOD AND DEVICE FOR PRODUCING SINGLE CRYSTALS IN A SAFE MANNER WITH REGARD TO THE PROCESS

(71) Applicant: PVA TEPLA AG, Wettenberg (DE)

(72) Inventors: Michael Schöler, Insingen (DE); Lorenz Vogel, Staufenberg (DE); Karsten Viehmann, Hüttenberg (DE); Tomas Baumecker, Grünberg (DE)

(73) Assignee: PVA TEPLA AG, Wettenberg (DE)

( * ) Notice: Subject to any disclaimer, the term of this patent is extended or adjusted under 35 U.S.C. 154(b) by 0 days.

(21) Appl. No.: 18/690,530

(22) PCT Filed: Sep. 16, 2022

(86) PCT No.: PCT/EP2022/075759
§ 371 (c)(1),
(2) Date: Mar. 8, 2024

(87) PCT Pub. No.: WO2023/041703
PCT Pub. Date: Mar. 23, 2023

(65) Prior Publication Data
US 2024/0376633 A1    Nov. 14, 2024

(30) Foreign Application Priority Data
Sep. 16, 2021    (DE) ............... 10 2021 123 991.5

(51) Int. Cl.
*C30B 23/06*    (2006.01)
*C23C 14/06*    (2006.01)
(Continued)

(52) U.S. Cl.
CPC ........ *C30B 23/002* (2013.01); *C23C 14/0635* (2013.01); *C23C 14/24* (2013.01);
(Continued)

(58) Field of Classification Search
CPC ....... C30B 23/002; C30B 23/06; C30B 29/36; C23C 14/24; C23C 14/54; C23C 14/0635
See application file for complete search history.

(56) References Cited

U.S. PATENT DOCUMENTS

2012/0000414 A1\* 1/2012 Bondokov ............ C30B 23/002
                                                                118/724
2012/0192790 A1  8/2012 Chen
(Continued)

FOREIGN PATENT DOCUMENTS

DE    112013006709 T5    11/2015
GB    772691 A    4/1957
(Continued)

OTHER PUBLICATIONS

International Search Report and Written Opinion corresponding to application PCT/EP2022/075759, dated Jan. 2, 2023, 9 pages.
(Continued)

*Primary Examiner* — Robert M Kunemund
(74) *Attorney, Agent, or Firm* — Reising Ethington P.C.

(57) ABSTRACT

A PVT method is utilized for production of single crystals in an apparatus, which comprises a growth cell, a process chamber in which the growth cell is located and a heating device surrounding the process chamber for heating the growth cell. In this method, a source material and a seed are introduced into the growth cell, and the process chamber is filled with a process gas and the growth cell is heated, causing the source material to sublimated and resublimated at the seed. An apparatus designed for production of single crystals using the PVT method includes a highly heatable growth cell for accommodation of a source material and a seed, a process chamber accommodating the growth cell
(Continued)

with a connection to a process gas source for filling it with a process gas, and a heating device for heating the growth cell.

13 Claims, 6 Drawing Sheets

(51) Int. Cl.
  *C23C 14/24* (2006.01)
  *C23C 14/54* (2006.01)
  *C30B 23/00* (2006.01)
  *C30B 29/36* (2006.01)

(52) U.S. Cl.
  CPC .............. *C23C 14/54* (2013.01); *C30B 23/06* (2013.01); *C30B 29/36* (2013.01)

(56) References Cited

U.S. PATENT DOCUMENTS

| 2021/0317593 | A1* | 10/2021 | Park | C30B 23/06 |
| 2021/0372003 | A1* | 12/2021 | Jang | C30B 29/36 |
| 2022/0020852 | A1* | 1/2022 | Park | H01L 21/02529 |

FOREIGN PATENT DOCUMENTS

| JP | H04193799 A | 7/1992 | |
| WO | WO-2020218483 A1 * | 10/2020 | C30B 23/02 |
| WO | WO-2020235315 A1 * | 11/2020 | |

OTHER PUBLICATIONS

English translation of International Search Report corresponding to application PCT/EP2022/075759, dated Jan. 2, 2023, 2 pages.

* cited by examiner

PVT-METHOD AND DEVICE FOR PRODUCING SINGLE CRYSTALS IN A SAFE MANNER WITH REGARD TO THE PROCESS

TECHNICAL FIELD

The present disclosure relates to a PVT process for the process-safe production of single crystals in an apparatus which has a highly heatable growth cell, a process chamber in which the growth cell is located and a heating device surrounding the process chamber for heating the growth cell, wherein a source material and a seed are introduced into the growth cell, the process chamber is filled with a process gas and the growth cell is heated so that the source material is sublimated and resublimated on the seed.

BACKGROUND

In the industrial environment, the so-called Physical Vapor Transport (PVT) process is considered the standard method for producing single-crystal silicon carbide crystals (SiC crystals). The source material is usually a powder that contains many different crystallites. The use of bulk crystals is also possible. The high-temperature chemical vapor deposition (HT-CVD) process is known as an alternative process. In the PVT process, crystal growth typically takes place within the growth cell consisting of graphite by sublimation of a SiC source material and crystallization on a predetermined SiC seed at temperatures of over 2,000° C. The driving force for crystal growth is a temperature gradient that is imposed on the growth cell by a heating device. Common methods for heating PVT apparatus use resistance heaters or induction heaters. In induction heating, the growth cell (hot zone) of the vacuum-tight process chamber is surrounded by a non-conductive material, typically (quartz) glass, which contains process gases that are used to influence crystal growth, among other things. The process chamber can be single- or double-walled and, respectively, can be air- or water-cooled. The process gases typically used are argon, helium, nitrogen, hydrogen and possibly other gases for an intended doping. The process pressure can range from vacuum conditions to amospheric pressure. In common processes for the production of doped SiC single crystals, no hydrogen or only low concentrations thereof are used.

SiC single crystals are used for a variety of applications in semiconductor technology due to their large band gap and high thermal conductivity.

The underlying process for producing SiC single crystals has therefore already been the subject of many documents. As an example, reference is made to US 2011/0300323 A1. According to this, an inert gas is used as the process gas, which is unproblematic from a safety point of view. Reference is also made to EP 0 811 708 A2, US 2012/0086001 A1, GB 772,691, DE 60 2004 001 802 T2 and EP 3 760 765 A1 as prior art.

The present disclosure provides a process method for influencing of the dopant incorporation or for the production of undoped SiC single crystals. The present disclosure develops the use of a reactive gas, i.e. a combustible and/or reactive (possibly also toxic) gas, e.g. hydrogen as a process gas, with concentrations of over 5% and up to 100%, to ensure a process sequence safely, with better results than in the state of the art and yet cost-effectively.

The gas molecules of the reactive gas, such as hydrogen atoms, attach themselves to the surface of the growing single crystal, but are immediately displaced by the following sublimated components of the source material. In this case, the reactive gas molecules, such as water atoms, serve as placeholders for a short time, so that a crystal lattice with few defects, or even without defects, can be formed. Reactive gas molecules can also react with other process gases, the source material or even the hot zone material and form other gaseous species that can enter the process gas atmosphere and attach to the crystal, at least temporarily. Possible reactive gases such as silane, methane, propane, etc. provide the elements silicon and carbon, among others, which are incorporated into the crystal. The addition of reactive gases can influence the overall defect density (desired and/or undesired). However, the exact influence depends on a large number of parameters and their interaction. The addition of reactive gas is provided to influence crystal growth.

The present disclosure provides sa device and a method with which improved or modified crystal growth is made possible.

The present disclosure further provides a device and a method in which a reactive gas can be used to improve crystal growth.

The present disclosure further provides a device and a method by means of which improved crystals can be provided at low cost or at low expense.

However, the use of a reactive gas, comprising e.g. hydrogen or other reactive elements, represents a potential hazard when carrying out the process. A reactive gas can, for example, be combustible or flammable and/or toxic. In the case of the example of hydrogen, an oxyhydrogen reaction can take place with the oxygen in the air, which is why hydrogen is referred to as a reactive gas in this description. Other examples of reactive gases that currently come into question include, in addition to hydrogen, precursors containing carbon and silicon or hydrocarbons and their derivatives (examples: silane or methane, propane, etc.).

In addition, the process chamber in today's conventional devices is typically made of quartz glass, which is naturally brittle and tends to break. However, it is at present preferable to use quartz glass because it can withstand the high temperatures of the growth cell and because it does not shield the electromagnetic field of an induction coil or the radiant heat of a resistance heater. A combination of induction and resistance heaters can also be provided. For example, an additional floor or ceiling heater can be designed as a resistance heater, while the main heater is designed as an induction heater. In principle, however, the safety requirements also apply in a similar way to other construction materials for providing the process chamber, at least in the case of e.g. quartz glass.

If the process chamber is damaged or leaks, for example if the quartz glass breaks, the hydrogen can mix with the oxygen in the environment and an oxyhydrogen gas is produced, which is ignited by the heating device (hot components of the hot zone, or graphite parts inside the process chamber) and explodes. If a reactive gas is used, it is therefore not possible to carry out the process safely with the known devices.

A reactive gas mentioned in the present disclosure—such as hydrogen—is not to be equated with known doping gases. Known typical doping gases are not used in the concentrations desired here, and/or are neither flammable nor reactive in any other way in the sense used in this description. Doping gases are flushed around the crystal, so the processes take place entirely in the process chamber. In this context, for example, the process chamber can also be purged with an inert gas such as argon in order to modify the PVT process directly. In general, doping gases are provided to be incorporated into the crystal or the crystal structure—from which the term "doping gas" is derived—in order to influence the physical and/or chemical properties of the crystal, for example the electrical conductivity. In other words, molecules or components of a doping gas form a later integral part of the crystal. Such molecules or components of a doping gas remain in the crystal and the presence of the same in the crystal structure can be verified later.

In contrast, a reactive gas such as hydrogen can influence crystal growth and dopant incorporation as a reactive component of the gas atmosphere, but is not provided to be incorporated into the crystal like dopant gas in order to influence the physical and chemical properties of the crystal. Due to the hazard potential of reactive gases, such as ignition, combustion, deflagration or poisoning potential, reactive gases have not yet been considered for use to improve crystal growth, or at least the safety aspects of handling a reactive gas in this environment, as described above, have not been sufficiently taken into account. Furthermore, the reactive gas to be used is not a source material in the true sense of the word. In typical PVT processes, the source material is SiC powder. In variants of the classic PVT process, such as HT-CVD, hydrogen can be used as a carrier gas that transports the actual source material, usually gaseous C- or Si-containing precursors. The gas thus serves as a carrier gas, i.e. as a transport medium for precursors and dopants. Dopants can be solid, liquid or gaseous elements or compounds that typically contain nitrogen, phosphorus, aluminium, boron or vanadium.

As part of this further development and improvement, the containment vessel surrounding the process chamber was designed with the present disclosure. Furthermore, the provision of a protective atmosphere, such as with inert gas, in the area between the process chamber and the container wall was investigated. One benefit of the containment vessel is to avoid or prevent an explosive gas mixture in the event of damage, i.e. breakage, of the process chamber.

In order to carry out the process safely, an apparatus for carrying out the process could be arranged in a vacuum cell. However, such a cell would have to be absolutely vacuum-tight and is therefore comparatively complex to manufacture because a large number of feedthroughs are required to supply the apparatus with electricity, gas and possibly cooling fluid, each of which must be prepared to be vacuum-tight.

On the other hand, it may be desirable to present a PVT process for the safe production of single crystals that can be carried out in an apparatus that is easy to manufacture and/or inexpensive.

The problem is solved by the present disclosure defined in the independent claims. Dependent claims provide further embodiments and preferred embodiments of the present disclosure.

To solve the problem, the present disclosure provides that the process gas consists partly or completely of a reactive gas and that the process chamber is arranged in a safety container, wherein an intermediate space between a container wall of the safety container and the process chamber is flooded with a protective atmosphere, for example an inert gas, in order to displace the air contained therein before the sublimation of the source material is initiated.

The containment vessel should be flooded at the latest when the sublimation of the source material takes place, as high temperatures are then present that are capable of igniting the reactive gas. For safety reasons, however, the flooding of the containment vessel should take place before the reactive gas is introduced into the process chamber.

If the process chamber is damaged in this arrangement—for example if it breaks—the reactive gas in the process chamber mixes in the protective atmosphere in the containment, for example with the inert gas, to form a non-explosive gas mixture, so that an explosion cannot occur even in a hot environment.

This safety measure is desirable if the reactive gas is flammable or tends to deflagrate, such as hydrogen.

The containment vessel is particularly easy to implement if it is constructed in such a way that it allows gas losses to the outside, especially to a small extent, i.e. is only approximately gas-tight. This makes the design of the containment vessel more cost-effective, as requirements for particularly high hermeticity do not have to be taken into account and yet no undesirable reactions of the reactive gas can occur outside the process chamber. For example, the containment can have a permissible leakage rate that is greater than 0 l/min. For cost reasons, it may be unproblematic, for example due to the choice and geometry of the design, to allow a leak rate that is in the range 0≤leak rate≤5 l/min, or even in the range 0≤leak rate≤30 l/min. For example, the leak rate to be permitted can be greater than 2 ml/min, less preferably greater than 5 ml/min, even less preferably greater than 10 ml/min, even less preferably greater than 50 ml/min or even 100 ml/min. On the other hand, it does not make sense to allow an excessively high leakage rate of the containment vessel for economic reasons and possibly for reasons of workplace safety. For example, it may be desirable to limit the leakage rate to less than 30 l/min, preferably less than 10 l/min, more preferably less than 4 l/min, still more preferably less than 1 l/min, still more preferably less than 500 ml/min, and still more preferably less than 150 ml/min. The aim is to achieve leakage rates in a range from 2 ml/min to 50 ml/min, preferably from 10 ml/min to 20 ml/min.

To maintain the protective atmosphere, inert gas can be added, for example, to compensate for gas losses and to build up and/or maintain an overpressure in the containment vessel. The overpressure prevents atmospheric oxygen from entering the containment vessel from outside. Thus, a relative overpressure can be maintained in the containment vessel by means of a pressure control system, for example in a range of 1 mBar above ambient pressure or more, preferably 3 mBar or more, more preferably 5 mBar or more, to 50 mBar above ambient pressure or less, preferably 30 mBar or less. However, a completely gas-tight containment vessel with a leakage rate of 0 ml/min or a leakage rate that is not measurably low is also fundamentally covered by this, in which an overpressure can also be maintained in the containment vessel.

In order to ensure the most complete possible displacement of air from the containment vessel, the present disclosure may further provide that a first inert gas is introduced into the containment vessel for flooding the containment vessel. The first inert gas can be heavier than air, so that it is let into the lower area of the containment vessel, displacing the air upwards. For example, a closable outlet at the upper end of the containment can remain open until the air has escaped.

Preferably, the protective atmosphere comprises an inert gas such as argon. Due to the high density of argon, it collects at the bottom of the containment vessel and slowly displaces the air upwards without mixing with it. Other examples of protective atmospheres that are currently commercially available include xenon, nitrogen and carbon dioxide. In principle, the protective atmosphere can comprise any fluid, whether individually or as a mixture, which is able to provide a protective function in that it neutralizes the reactive gas in the event of excessive or impermissible escape from the process chamber and/or prevents negative effects such as deflagrations. The protective atmosphere can, for example, also be present under normal conditions of the standard atmosphere in a liquid or solid state.

When the air has been displaced by the first inert gas, it can be replaced by another, for example a less expensive, inert gas. The present disclosure therefore further provides that after the containment vessel has been flooded once or several times with the first inert gas, it is replaced by the second inert gas, such as nitrogen.

In order to ensure that the reactive gas is not fed into the apparatus in the event of a rupture of the process chamber, it is desirable that the containment vessel has a gas sensor that is capable of detecting the presence of reactive gas in the containment vessel. Furthermore, it may be provided that the process gas supply to the process chamber is interrupted when the gas sensor detects the reactive gas in the containment vessel.

In a further development, the gas supply can be interrupted via a further pressure sensor or pressure switch, which monitors the pressure inside the process chamber, in case that a lower pressure is detected in the event of damage, such as breakage of the quartz glass. For example, a drop in the absolute pressure to p≤980 mbarAbs, preferably to p≤950 mbarAbs, more preferably to p≤920 mbarAbs can be detected for monitoring purposes. The reactive gas supply can therefore also be interrupted independently of the detection of reactive gas, such as hydrogen, in the space between the process chamber and the surrounding cooling device.

An opening of the process chamber, for example if the quartz glass breaks, can be detected or indicated e.g. by one of the following criteria. The reactive gas/hydrogen can be detected by a gas sensor in the containment. Alternatively or cumulatively, the overpressure in the containment can be detected and a process malfunction can be concluded when the overpressure disappears (e.g. p<=approx. 2 mbar over atmosphere).

Furthermore, the pressure in the process chamber can be measured alternatively or cumulatively, and as long as this pressure ≤950 mbarAbs (or 920 or 980) is maintained, no process malfunction is detected, whereas exceeding the pressure threshold can indicate a process malfunction. Alternatively or cumulatively, a sudden pressure surge/pressure increase in the process chamber (pressure increase rate greater than the maximum possible pressure increase rate due to gases to be introduced) can also be detected and indicate a process fault—such as a quartz glass breakage. The aforementioned criteria are independent of each other and can be used individually or in conjunction with each other to switch off the process gas or hydrogen supply.

The containment vessel can provide a cooling function. The cooling function can, for example, be designed so that a cooling medium, such as water, circulates around or through the containment vessel. For example, the containment can have a cooling medium line through which the cooling medium flows. The cooling medium line can be attached to the container wall of the containment vessel or in any case be connected to it in a heat-conducting manner, possibly with the aid of a heat-conducting paste. For example, the cooling medium line is soldered to the container wall. For example, the cooling medium line comprises copper, which is easy to process and/or is particularly thermally conductive.

The containment can be equipped to provide temperature control of the process conditions. For example, constant temperatures—or a similar temperature range—can always be maintained by means of the containment vessel designed in this way, regardless of the ambient conditions, which may fluctuate considerably. For example, the environment may include a daily temperature curve or seasonal temperature fluctuations, or may also be influenced by any thermal processes taking place in the vicinity, whereby the designed containment vessel is able to keep these ambient conditions away from the process. Alternatively or cumulatively, the cooling function can also be influenced in response to the process parameters, i.e. the temperature in the process chamber, in order to achieve temperature control of the growth process. For example, the cooling medium flow rate through the at least one cooling medium line can be changed in response to the ambient conditions and/or the process parameters in order to change the heat removal. If the environment and/or process temperature is warmer, for example, more cooling medium can be circulated and/or a colder cooling medium can be used and/or an alternative cooling medium can be filled in.

The cooling medium line can be arranged on the outside of the container wall, preferably thermally conductively connected to the container wall or in any case arranged adjacent to the container wall. The cooling medium line can then cool the container wall and ensure that the heat does not radiate into the immediate vicinity of the apparatus, but is carried away by the temperature control device. The benefit of arranging the cooling medium line on the outside is that there are fewer feed-throughs to be sealed in the protective atmosphere or the inside of the protective container, as the cooling fluid does not penetrate into the interior. For example, the container wall can be double-walled, i.e. have an inner wall and an outer wall, whereby the cooling medium line can be arranged between the inner wall and the outer wall of the container wall. The cooling medium line and the fastenings for the cooling medium line are then hidden from view and protected from mechanical damage. As the temperature control device is able to dissipate a significant proportion of the heat output from the process chamber, the outer wall of the container wall is subject to no or few restrictions in terms of material selection or contact protection, as it does not become hot.

The present disclosure also relates to an apparatus for the process-safe production of single crystals using the PVT process, which has a highly heatable growth cell for accommodation of a source material and a seed, a process chamber in which the growth cell is located and which has a connection to a process gas source for filling it with a process gas, and a heating device for heating the growth cell.

In order to ensure process-safe operation with a reactive gas as process gas, the present disclosure provides that the apparatus has a containment vessel with a container wall, in which the process chamber is arranged, the containment vessel having a connection to an inert gas source in order to be able to flood an intermediate space between the container wall of the containment vessel and the process chamber with an inert gas before the PVT process is carried out.

The containment can be constructed in such a way that it allows gas losses to the outside. It can have a pressure sensor, whereby the pressure sensor is connected to a control device and the control device is designed in such a way that an overpressure in the containment (compared to the environment or atmosphere) is set on the basis of the pressure sensor signals.

The pressure sensor can also include pressure switches or be formed from a pressure switch. For example, the pressure sensor can be formed by a differential pressure switch that measures the pressure difference between the inertization in the containment and the atmosphere or environment. If necessary, the pressure sensor can then trigger a circuit when the pressure exceeds or falls below an adjustable pressure difference, for example as a safety circuit or shut-off.

With regard to the installation of the apparatus, there is an inert gas connection in the lower area of the containment vessel and a sealable outlet in its upper area. As a result, the air in the containment is completely displaced upwards to the outlet by the inert gas flowing in at the bottom, where it leaves the containment.

The containment vessel preferably has two inert gas connections for two different inert gases. After the first inert gas has displaced the air from the containment vessel, the second inert gas connection can be used to fill in a less expensive fluid, such as nitrogen, a second fluid, thus replacing the first inert gas.

The containment preferably has a gas sensor that responds to a reactive gas. In this way, it can be determined that reactive gas (e.g. hydrogen) has entered the containment, for example in the event of a rupture of the process chamber.

As explained above, the apparatus can be used to produce a SiC single crystal, for example using the PVT process. For this purpose, the growth cell is equipped with a silicon carbide as a source material and the process chamber is flooded with hydrogen as a reactive gas in addition to other process gases (e.g. argon).

DETAILED DESCRIPTION

Figure 1:
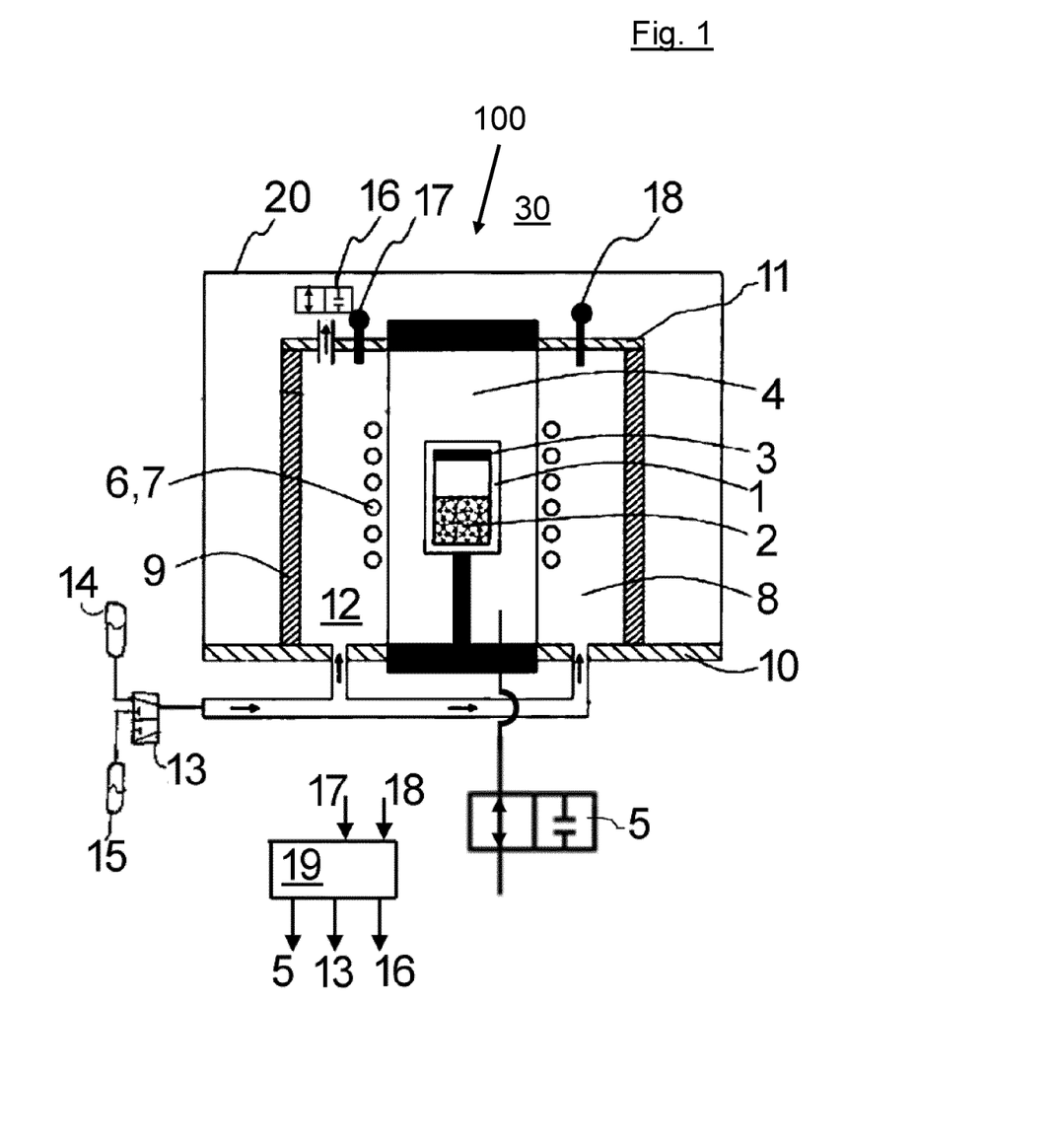
FIG. 1 is a cross-sectional view of an apparatus according to the present disclosure.

In the following, the present disclosure is illustrated in more detail by means of embodiments and with reference to the figures, whereby identical and similar elements are sometimes provided with the same reference symbols and the features of the various embodiments can be combined with one another. FIG. 1 shows a cross-sectional view of an apparatus according to the present disclosure.

In the center of the apparatus, standing on a stand, is a growth cell 1 consisting of a hollow cylinder with a base and a lid that close the two ends of the hollow cylinder. The growth cell 1 consists of a porous graphite. A swelling material 2 is layered on the base. A seed 3 is located on the underside of the lid.

The growth cell 1 is arranged in a process chamber 4, which consists of a hollow cylinder closed at both ends by a floor or ceiling. The cylindrical wall of the process chamber 4 consists of a heat-resistant quartz glass and can be filled with a process gas via a process gas connection with an inlet valve 5. As the graphite of the growth cell 1 is porous, the process gas from the process chamber 4 also enters the growth cell 1.

A heating device 6 consists of an induction coil 7 that surrounds the process chamber 4 at the level of the growth cell. When an electric current flows through it, it generates an electromagnetic field that induces an electric current in the graphite of the growth cell 1, which heats the growth cell 1 to over 2,000° C. up to 2,400° C.

The high temperatures and the required permeability for the electromagnetic field of the induction coil 7 make it necessary to manufacture at least the cylindrical wall of the process chamber 4 from a suitable temperature-resistant material. Usually, the cylindrical wall of the process chamber 4 is made of quartz glass, which has proven to be suitable and is inexpensive to manufacture.

To produce a SiC single crystal, silicon carbide is placed in the growth cell 1 and the process chamber 4 is flooded with a process gas that consists of up to 100% hydrogen. If the growth cell 1 is heated using the induction coil 7, the silicon carbide sublimates and attaches itself layer by layer to the seed 3 so that a SiC single crystal grows. The hydrogen ensures that no crystal defects occur in the crystal or that impurity atoms could be deposited at the respective growth site. The incorporation of undesired impurity atoms regularly leads to a change in electrical conductivity, which may also occur locally and can be detrimental as a disruption or reduction in quality. The composition of the process gas can also be influenced by reactions with other process gases or the hot zone (graphite components) through the use of the reactive gas. The changed process gas composition can in turn have an influence on the crystallinity, structure, crystal defects and doping of the SiC crystal.

For example, it has been shown that desirable effects are achieved from a hydrogen content of 5% or more in the process gas, whereby in such low concentrations of less than 5% hydrogen in the process gas typically no protective measures are necessary, for example regarding explosion protection. Desirable results were obtained in the range between 5% hydrogen content and about 40% hydrogen content, whereby an increased degree of purity of the crystal could be obtained in the range of 15% hydrogen content in the process gas (preferably around ±5%). In principle, however, the use of a containment vessel according to the present disclosure is also desirable at low concentrations.

However, as described above, the use of a reactive gas such as hydrogen is problematic because, in the event of a potential rupture of the wall of the process chamber 4, the reactive gas—without the containment vessel according to the present disclosure—mixes with the ambient air, so that, for example, an ignitable gas mixture can form which would immediately ignite on the hot parts of the apparatus.

The process chamber 4 of the embodiment example shown here is therefore surrounded by a containment vessel 8, which comprises a cylindrical vessel wall 9 surrounding the cylindrical wall of the process chamber 4, which stands on a base 10 and is closed at the top by a ceiling 11. The base 10 and ceiling 11 of the containment vessel 8 are connected to the base and ceiling of the process chamber 4.

The containment vessel 8 can also be part of the cooling concept of the apparatus. In other words, the containment vessel 8 can be integrated into the cooling concept of the apparatus. For this purpose, the cylindrical container wall 9) can be provided with cooling channels that are connected to a cooling system. The cooling concept can therefore provide for the containment 8 to provide a cooling function for the apparatus. For example, a cooling medium, such as water, can circulate through the containment vessel 8. On the other hand, the safety atmosphere (or protective atmosphere) in the containment vessel 8 can provide the cooling function. For example, the safety atmosphere can be circulated in order to dissipate heat. Overall, the containment can be equipped in such a way that the containment with its cooling function can be used to control the temperature of the process conditions so that constant temperatures—or a similar temperature range—can always be maintained, regardless of the ambient conditions, which may fluctuate considerably. For example, the environment may include a daily temperature curve or seasonal temperature fluctuations, or may also be influenced by any thermal processes taking place in the vicinity.

Finally, the containment 8 can be constructed in such a way that it is metallically conductive. The metallically conductive containment 8 can provide shielding in the manner of a Faraday cage for the process taking place inside, so that, for example, alternating electromagnetic fields in the container wall 9 of the containment 8 have a defined end point and do not run out asymptotically, potentially to infinity. This can be desirable if several apparatuses are to be set up next to each other, whereby corresponding alternating fields can influence each other and interfere with the process conditions. In other words, the metallically conductive containment 8 can ensure uniform process conditions even if several devices, possibly of different types, are set up close to each other without the processes interfering with each other.

Overall, it can be seen that the containment vessel 8 is able to solve several tasks in a synergistic manner. Not only is it able to provide the aforementioned protective atmosphere that enables the use of a reactive gas in the process chamber. In addition, the containment 8 is able to shield the process chamber from various ambient conditions such as temperature fluctuations or fluctuating electrical and/or magnetic fields and thus ensure uniform process conditions for the process running in the process chamber.

In the base of the containment vessel 8 there is a ring line with one or more connections to an annular intermediate space 12 between the vessel wall 9 of the containment vessel 8 and the cylindrical wall of the process chamber 4, which is made of quartz glass. The ring line is connected to an argon source 14 and a nitrogen source 15 via a shuttle valve 13.

A closable outlet valve 16 is located in the ceiling 11 of the containment vessel 8. A gas sensor 17 (for example as a hydrogen sensor) and a pressure sensor 18 are also provided there.

A cover 20 made of break-proof plastic or sheet metal can be placed over the entire apparatus, which sits on the base of the containment vessel 8.

Furthermore, a control device 19 is provided, which is signal-connected to both sensors 17, 18 and controls the shuttle valve 13, the outlet valve 16 and the inlet valve 5 for the hydrogen supply via control lines.

The control device 19 allows the following procedures to be carried out:

Filling the safety container 8 with an inert gas before the process chamber 4 is filled with hydrogen:
(1) The outlet valve 16 is opened.
(2) The shuttle valve 13 is switched so that argon gas from the argon source 14 slowly flows into the intermediate space 12 from below, so that the intermediate space 12 fills with the argon gas from below, whereby the air present is displaced by the open outlet valve 16 (or pressure relief valve or the like).
(3) Close the outlet valve 16 and the shuttle valve 13.
(4) Take a filling break to allow any remaining air from the argon gas to settle to the top.
(5) If necessary, repeat steps (1) to (3) once or several times.
(6) Opening the outlet valve 16.
(7) Switching the shuttle valve 13 so that nitrogen gas slowly flows into the intermediate space 12 from below, whereby the intermediate space 12 fills from below with the nitrogen gas from the nitrogen source 15 and the argon gas present is displaced through the open outlet valve 16.
(8) Closing the outlet valve 16.
(9) Setting and maintaining an overpressure in the intermediate space 12 by controlled opening of the shuttle valve 13, so that no air can flow into the intermediate space 12 despite existing and accepted leaks in the containment vessel.

A sufficient overpressure is approx. 2 mbar above ambient.

In any case, steps (1) to (3) and (9) must be carried out. Steps (4) and (6) to (8) are optional.

In order to be able to check whether the intermediate space 12 is sufficiently oxygen-free, an oxygen sensor can also be provided.

Behaviours in the event of breakage of the glass wall during operation:
(1) Continuous monitoring of the gas sensor 17 and
(2) Closing the hydrogen supply when the gas sensor 17 detects hydrogen in the intermediate space 12.

Figure 2:
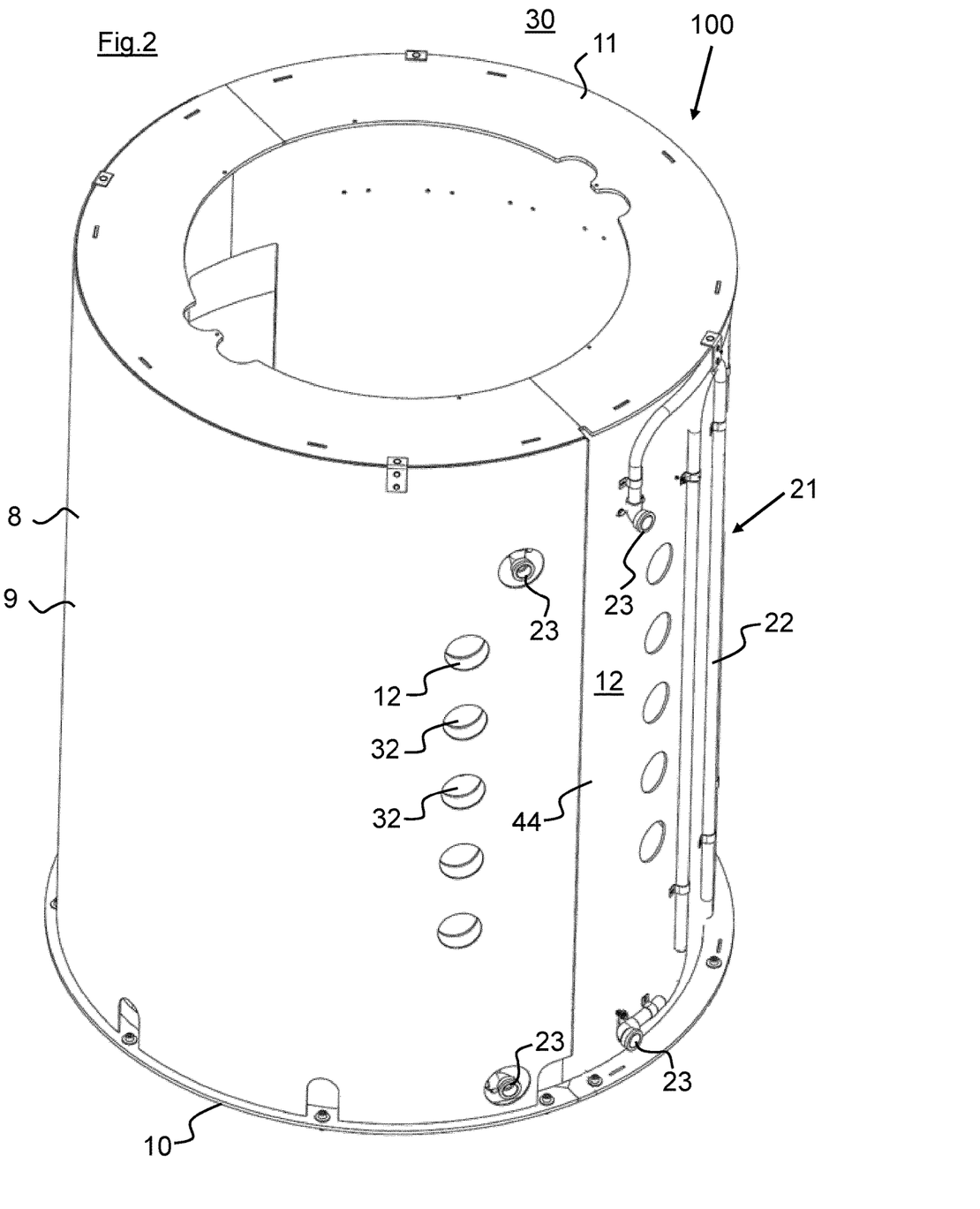
FIG. 2 is a perspective and simplified view of a partially assembled containment vessel, FIG. 3 a perspective sectional view of an embodiment of an apparatus, FIG. 4 a detail of a connection of the temperature control device of the containment vessel, FIG. 5 a segment of the container wall of the containment vessel with part of the temperature control device, FIG. 6 a design of an exemplary segment of a container wall with temperature control device, FIG. 7 a perspective view of an embodiment of a containment 8.

With reference to FIG. 2, a perspective view of a simplified embodiment of a partially assembled containment vessel 8 is shown, whereby attachment parts and the process chamber 4 are not shown for reasons of clarity. For the sake of completeness, it should also be noted that the embodiment shown in FIG. 2 has no details for sealing the intermediate space 12, so that the leakage rates that can be achieved with this embodiment are comparatively high. Improved sealed containment vessels 8 are presented in the further figures.

In FIG. 2, a temperature control device 21 is arranged, at least partially, in the containment vessel 8, whereby a fluid can be fed into a coolant line 22 through connections 23. The coolant line 22 can be connected to the inner wall 44 of the containment vessel 8, for example glued, soldered, welded or screwed to it. From the process chamber 4, thermal power is predominantly transmitted as radiant heat to the inner wall 44, from where the thermal power can be efficiently dissipated by means of the temperature control device 21. For example, liquid water can be used as a coolant. The amount of heat that can be dissipated by the temperature control device 21 can preferably be adjustable. For example, the amount of heat that can be dissipated can be influenced via the temperature specification for the coolant and/or flow rate or speed, i.e. temperature control can be provided. Then, in response to sensor signals measuring the ambient temperature and/or the process temperature, temperature control of the process chamber 4 can be achieved with the temperature control, so that an constant temperature is present in the process chamber 4 during the process sequence.

Figure 4:
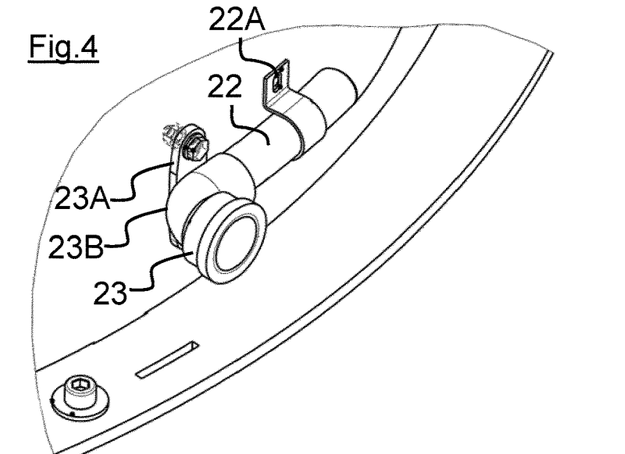

The containment 8 has sight glasses 32 that bridge the intermediate space 12 and allow a view of the process chamber 4, for example for the purpose of process monitoring. The sight glasses 32 are relatively small in order to minimize direct heat radiation. FIG. 4 also shows a detail of the coolant line 22 with line fastening 22A, connections 23, transition piece 23B and connection piece fastening 23A.

Figure 3:
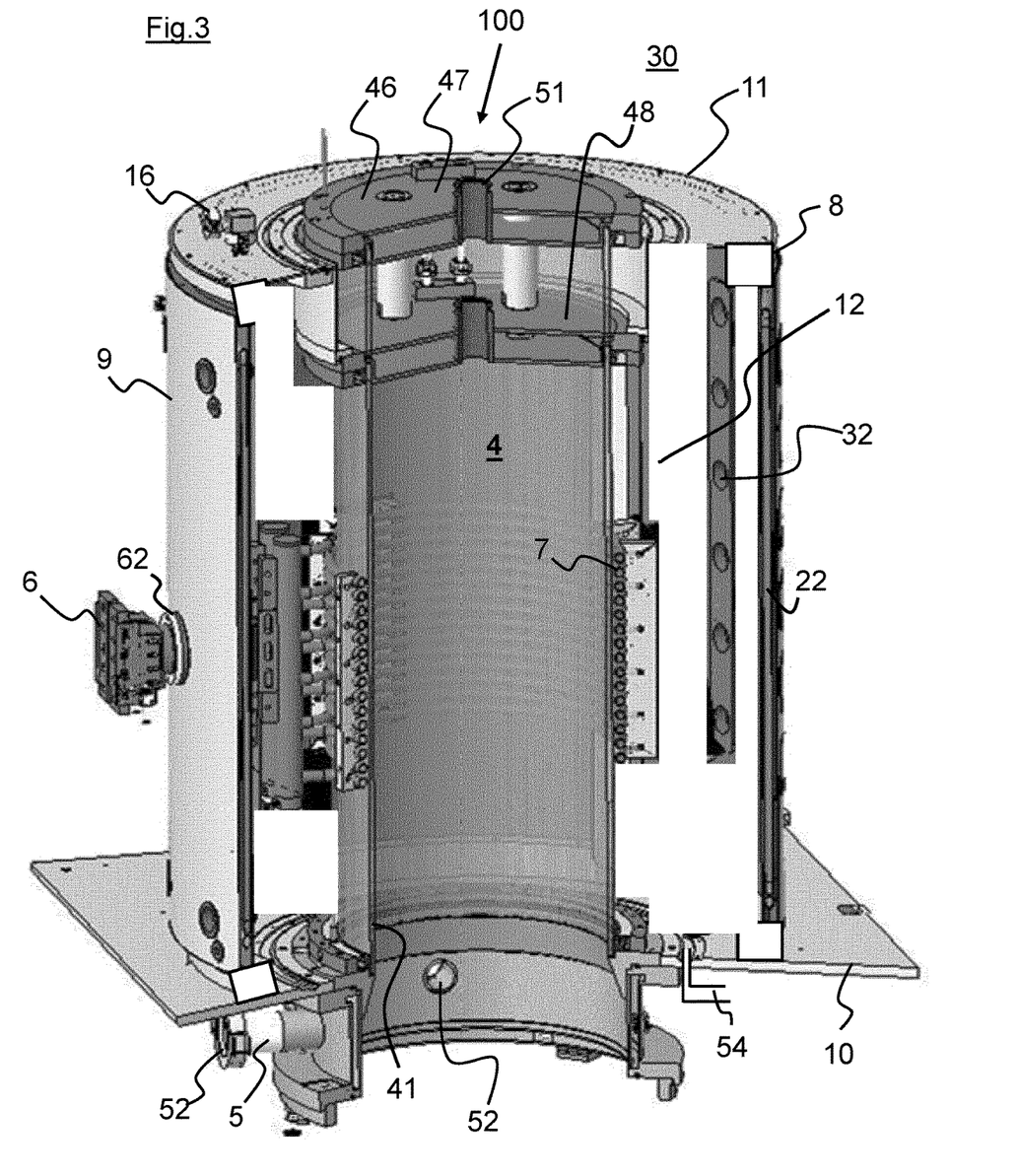

FIG. 3 shows a sectional view of an embodiment of an apparatus 100. A process chamber 4 is partially surrounded by an induction coil 7, which is supplied with electrical power by a heating device 6. The heating device 6 is arranged partially inside and outside the containment vessel 8, whereby, for example, the power electronics can be arranged outside, so that a sealed feedthrough 62 is provided to reduce gas leakage. The induction coil 7 with parts of the electronics is in the interior 12, i.e. in the space that can be occupied by the protective atmosphere.

The shielding gas can be supplied through the shielding gas supply 54 on the underside of the interior 12 (several shielding gas supplies 54 may be provided). The outlet valve 16 is arranged on the ceiling 11, by means of which, for example, the outside air (containing oxygen) initially arranged in the containment vessel 8 can be let out of the containment vessel 8, for example by letting in a protective gas that is heavier than air. Subsequently, if a connection line is connected to the outlet valve 16 (not shown), circulation of the shielding gas can also be provided, for example to remove heat from the containment vessel 8 or to ensure a regular exchange of the shielding gas.

In the case shown here, the coolant line 22 of the temperature control device 21 is arranged in the container wall 9, which is double-walled. In the cross-section of the containment vessel 8 with process chamber 4 shown in FIG. 3, the interior 12 of the containment vessel 8 for accommodating the protective atmosphere extends from the chamber wall 41 and, for example, around the process chamber 4 to the vessel wall 9, the intermediate space 12 being sealed against the vessel wall 9 in order to keep the gas leakage rate from the intermediate space 12 into the environment 30 low:

Furthermore, the embodiment shown in FIG. 3 shows a special feature in that the process chamber 4 is equipped with an adapter 46. In the embodiment shown, the adapter 46 has two alternative top covers 47, 48, so that the top cover 47 or the top cover 48 located further inside can be used depending on the desired process height. The covers 47, 48 can thus be used as alternatives to each other.

Figure 5:
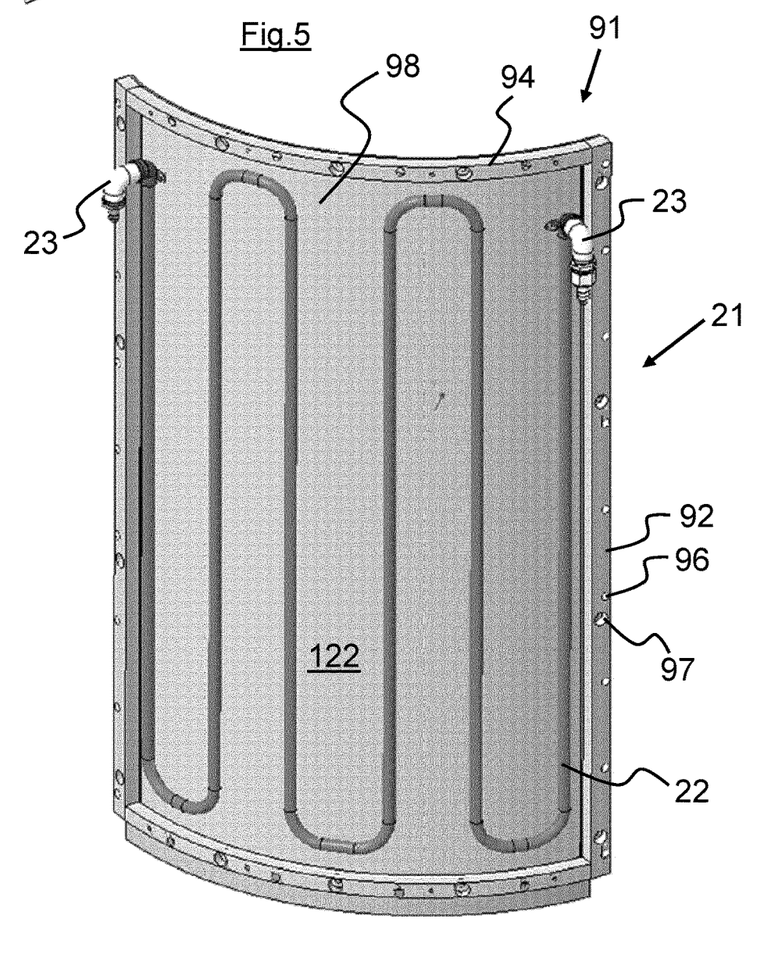

With reference to FIG. 5, a first segment 91 of the container wall 9 of a segmented containment vessel 8 with temperature control device 21 is shown, wherein the coolant line 22 is arranged in an intermediate region 122 in the container wall 9. In the case shown here, the container wall 9 comprises an inner wall 98, frame parts 92, 94 and the coolant line 22 of the temperature control device 21, which is arranged in an intermediate region 122. Frame parts 92, 94 are fastened to the first segment 91 by fastening means 97. Further fastening means 96 (e.g. screw holes) are arranged at regular intervals on the frame parts 92, 94, so that the intermediate region 122 is enclosed thereby.

Figure 6:
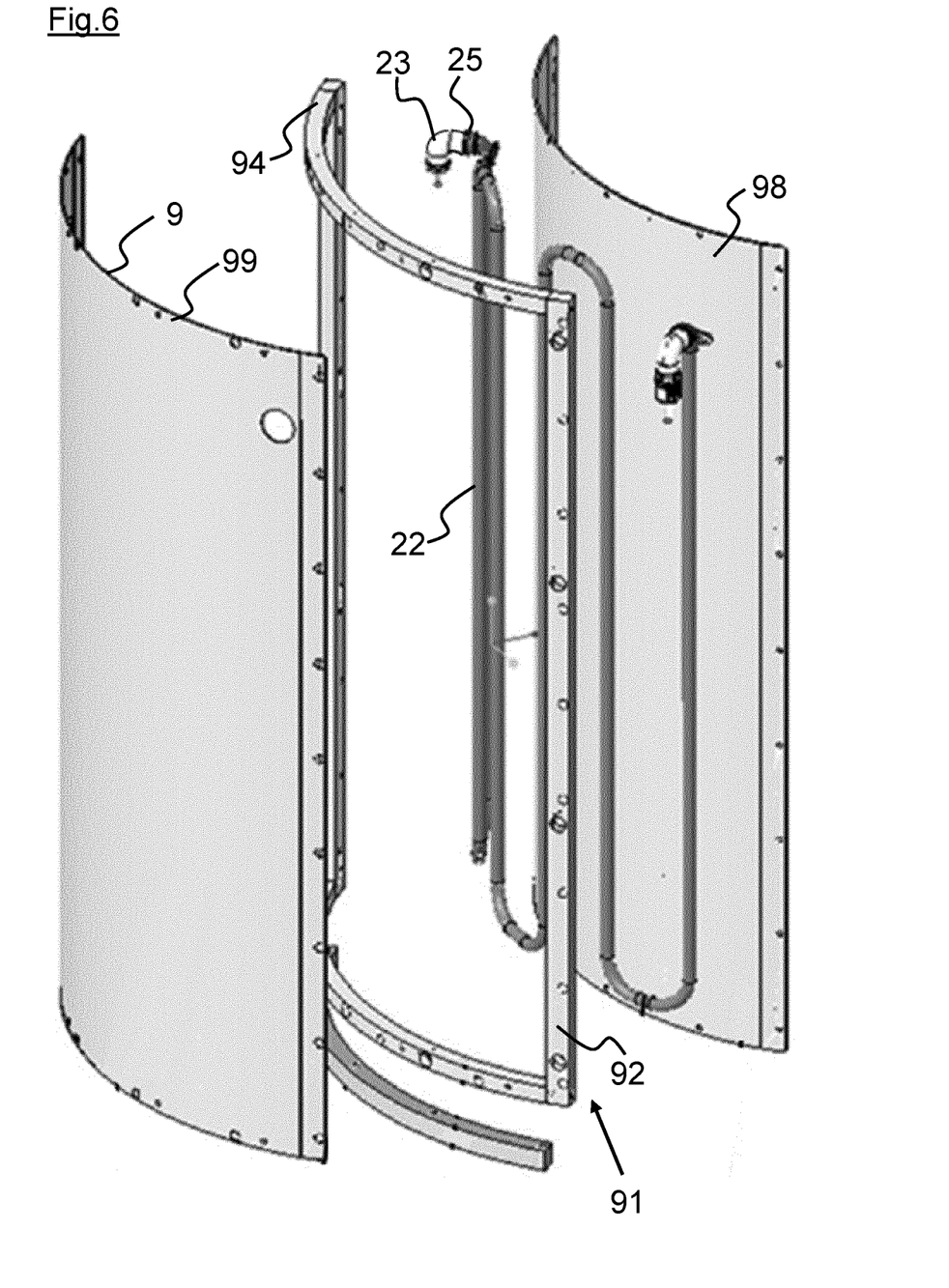

With reference to FIG. 6, a further embodiment of the first segment 91 with sandwich structure is further illustrated. The coolant line 22 of the temperature control device 21 is arranged on the inner wall 98 and can be connected to the outside by means of connections 23. A frame including the frame parts 92, 94 surrounds or limits the first segment 91 circumferentially, whereby an outer panel 99 can be screwed onto the frame parts 92, 94. The outer panel 99 covers the coolant line 22 and the fastening means 97 and thus protects them from access on the one hand and from improper damage on the other. The outer panel 99 thus conceals the technical installations from direct view and access and gives the apparatus 100 an attractive appearance.

Figure 7:
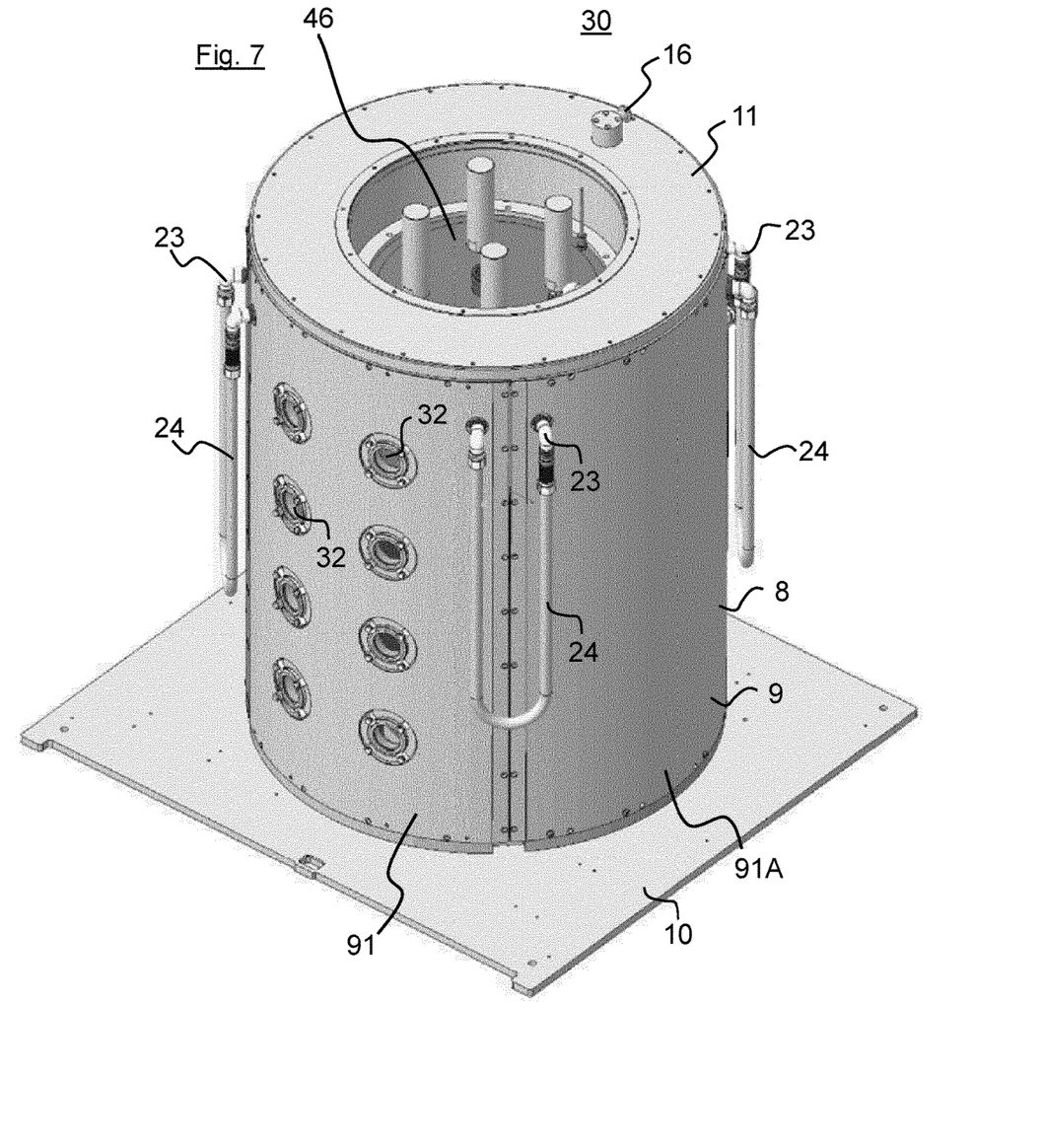

Finally, FIG. 7 shows an apparatus 100 mounted on the base 10 with a multi-part container wall 9, which comprises multiple segments 91 and 91A. The coolant lines 22 (see e.g. FIG. 5 or 6) run protected behind the outer panel 99 and are connected to each other by means of equalizing bends 24 so that a coolant—e.g. water—can flow through the temperature control device 21. The process chamber 4 (see e.g. FIG. 1 or 3) is surrounded on all sides by the protective atmosphere—or, depending on the embodiment, is surrounded on all sides by the protective atmosphere above the base 10. If the process chamber 4 bursts or otherwise fails and process gas escapes, the process gas mixes with the protective gas held in the intermediate space 12 to form a harmless mixed gas.

It is apparent to the skilled person that the embodiments described above are to be understood as exemplary and that the present disclosure is not limited to these, but can be varied in many ways without leaving the scope of protection of the claims. Furthermore, it is apparent that the features, irrespective of whether they are disclosed in the description, the claims, the figures or otherwise, also individually define components of the present disclosure, even if they are described together with other features. In all figures, the same reference signs represent the same objects, so that descriptions of objects which may only be mentioned in one or at least not with respect to all figures can also be transferred to these figures and embodiments with respect to which the object is not explicitly described in the description.

The invention claimed is:

1. A PVT method for production of single crystals in an apparatus, which has a growth cell, a process chamber in which the growth cell is located and a heating device surrounding the process chamber for heating the growth cell, wherein a swelling material and a seed being introduced into the growth cell, the process chamber being filled with a process gas and the growth cell being heated, so that the source material is sublimated and resublimated at the seed, characterized in that the process gas consists partly or completely of a reactive gas and in that the process chamber is arranged in a containment vessel, an intermediate chamber between a container wall of the containment vessel and the process chamber being flooded with a protective atmosphere in order to displace air present therein before the sublimation of the source material is initiated.

2. The PVT method according to claim 1, characterized in that the reactive gas comprises hydrogen, and/or in that the protective atmosphere comprises an inert gas.

3. The PVT method according to claim 1, characterized in that the containment vessel is constructed in such a way that it allows gas losses to the outside, and that inert gas is supplied to compensate for gas losses and to maintain an overpressure in the containment vessel.

4. The PVT method according to claim 3, characterized in that, for flooding the containment vessel, a first inert gas which is heavier than air is admitted into its lower region, the air being displaced upwards, a closable outlet at an upper end of the containment vessel remains open until the air has escaped.

5. The PVT method according to claim 4, characterized in that the first inert gas is argon.

6. The PVT method according to claim 4, characterized in that after the containment vessel has been flooded with the first inert gas, it is replaced by a second inert gas.

7. The PVT method according to claim 1, characterized in that the containment vessel has a gas sensor which is capable of detecting the reactive gas, and in that a process gas supply to the process chamber is interrupted when the gas sensor detects the reactive gas in the containment vessel.

8. An apparatus for production of single crystals by a PVT method, comprises a growth cell for receiving a source material and a seed, a process chamber in which the growth cell is located and which has a connection to a process gas source for filling it with a process gas, and a heating device for heating the growth cell, characterized in in that the apparatus has a containment vessel which has a container wall and in which the process chamber is arranged, and in that the containment vessel has a connection to a protective gas source to flood an intermediate chamber between the container wall of the containment vessel and the process chamber with a protective atmosphere before the PVT method is carried out.

9. The apparatus according to claim 8, characterized in that the containment vessel is constructed in such a way that it allows gas losses to the outside, that it has a pressure sensor and that the pressure sensor is signal-connected to a control device, the control device being designed in such a way that an overpressure in the containment vessel is set on a basis of pressure sensor signals.

10. The apparatus according to claim 8, characterized in that, with respect to an intended installation of the apparatus, an inert gas connection is located in its lower region of the containment vessel and a closable outlet is located in its upper region.

11. The apparatus according to claim 8, characterized in that the containment vessel has two inert gas connections for two different inert gases.

12. The apparatus according to claim 8, characterized in that the containment vessel comprises a gas sensor which responds to a reactive gas.

13. The apparatus according to claim 8, characterized in that the growth cell is equipped with a silicon carbide as source material and the process chamber is flooded with hydrogen as reactive gas.

* * * * *